United States Patent
Derksen et al.

(10) Patent No.: US 8,194,242 B2
(45) Date of Patent: Jun. 5, 2012

(54) SUBSTRATE DISTORTION MEASUREMENT

(75) Inventors: Antonius Theodorus Anna Maria Derksen, Eindhoven (NL); Pieter Willem Herman De Jager, Rotterdam (NL); Erik Marie Jose Smeets, Prinsenbeek (NL)

(73) Assignee: ASML Netherlands B.V., Veldhoven (NL)

( * ) Notice: Subject to any disclaimer, the term of this patent is extended or adjusted under 35 U.S.C. 154(b) by 1242 days.

(21) Appl. No.: 11/192,400

(22) Filed: Jul. 29, 2005

(65) Prior Publication Data
US 2007/0026325 A1 Feb. 1, 2007

(51) Int. Cl.
G03B 27/52 (2006.01)

(52) U.S. Cl. ............ 356/237.5; 356/124; 355/52

(58) Field of Classification Search .......... 356/237.5, 356/124; 355/52
See application file for complete search history.

(56) References Cited

U.S. PATENT DOCUMENTS

| | | | |
|---|---|---|---|
| 5,229,872 A | | 7/1993 | Mumola |
| 5,296,891 A | | 3/1994 | Vogt et al. |
| 5,460,034 A | * | 10/1995 | Herrick ............ 73/105 |
| 5,523,193 A | | 6/1996 | Nelson |
| 5,814,425 A | * | 9/1998 | Kataoka et al. ........ 430/30 |
| 6,389,074 B1 | | 5/2002 | Andrew |
| 6,717,671 B1 | * | 4/2004 | Meeks et al. ........ 356/369 |
| 6,813,001 B2 | * | 11/2004 | Fujisawa et al. ........ 355/53 |
| 7,050,605 B2 | * | 5/2006 | Gerson et al. ........ 382/100 |
| 7,148,971 B2 | * | 12/2006 | Stiblert et al. ........ 356/601 |
| 7,315,354 B2 | * | 1/2008 | Mizutani ............ 355/76 |
| 2002/0182547 A1 | * | 12/2002 | Raguin ............ 430/322 |
| 2003/0234918 A1 | | 12/2003 | Watson |
| 2004/0060033 A1 | * | 3/2004 | Kamon ............ 716/19 |
| 2004/0090606 A1 | | 5/2004 | Ishikawa |
| 2004/0133614 A1 | * | 7/2004 | Ozcan et al. ........ 708/404 |
| 2004/0257683 A1 | | 12/2004 | Petasch et al. |
| 2005/0007572 A1 | | 1/2005 | George et al. |
| 2005/0219515 A1 | * | 10/2005 | Morohoshi ............ 356/124 |
| 2007/0297715 A1 | * | 12/2007 | Little et al. ............ 385/14 |

FOREIGN PATENT DOCUMENTS

| | | |
|---|---|---|
| EP | 1 160 626 A1 | 12/2001 |
| EP | 1 482 375 A2 | 12/2004 |
| KR | 2003-0094353 A | 12/2003 |
| KR | 10-2004-0007444 A | 1/2004 |
| KR | 10-2004-0103423 A | 12/2004 |
| WO | WO 98/33096 | 7/1998 |
| WO | WO 98/38597 | 9/1998 |
| WO | WO 2004/109760 A2 | 12/2004 |

OTHER PUBLICATIONS

Notice of Reasons for Rejection for Patent Application No. 2005-375313 dated Jun. 10, 2008.
Kreyszig, Sixth Edition, Chapter 4 & 10 of Advanced Engineering Mathematics, pp. 181-643, 1988.

* cited by examiner

*Primary Examiner* — Gregory J Toatley
*Assistant Examiner* — Rebecca C Bryant
(74) *Attorney, Agent, or Firm* — Pillsbury Winthrop Shaw Pittman LLP (57) ABSTRACT

A distortion measurement apparatus comprising a detector arranged to measure distortion of a substrate, and a processor arranged to receive distortion data indicating the measured distortion of the substrate and to transform the distortion data into a frequency domain representation. The distortion data may alternatively be transformed into an orthogonal polynomial or an orthonormal polynomial representation.

18 Claims, 4 Drawing Sheets

SUBSTRATE DISTORTION MEASUREMENT

FIELD

The present invention relates to substrate distortion measurement in lithography applications and other applications.

BACKGROUND

Lithography is used to apply a desired pattern onto a substrate or part of a substrate. Lithography may be used, for example, in the manufacture of integrated circuits (ICs), flat panel displays, and other devices involving fine structures. In conventional lithography, a patterning device, which may be referred to as a mask or a reticle, may be used to generate a circuit pattern corresponding to an individual layer of a flat panel display (or other device). This pattern may be transferred on (part of) the substrate (e.g. a silicon wafer), e.g. via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may comprise a patterning array that comprises an array of individually controllable elements. An advantage of such a system compared to a mask-based system is that the pattern can be changed more quickly and for less cost.

Although lithography is conventionally used to image a pattern onto a silicon wafer, it may also be used to image a pattern onto any other suitable substrate. Substrates onto which patterns may be imaged include flat panel display substrates, and substrates formed from flexible plastic. Substrates of this type suffer from the disadvantage that they are more likely to suffer distortion than silicon wafers. It may be possible to measure the distortion of a substrate. However, the volume of data needed in order to represent the distortion may be prohibitive.

SUMMARY

According to an aspect of the invention there is provided a distortion measurement apparatus comprising a detector arranged to measure distortion of a substrate, and a processor arranged to receive distortion data indicating the measured distortion of the substrate and to transform the distortion data into a frequency domain representation.

The invention also provides a distortion measurement apparatus comprising a detector arranged to measure distortion of a substrate, and a processor arranged to receive distortion data indicating the measured distortion of the substrate and to transform the distortion data into an orthogonal polynomial representation.

The invention also provides a distortion measurement apparatus comprising a detector arranged to measure distortion of a substrate, and a processor arranged to receive distortion data indicating the measured distortion of the substrate and to transform the distortion data into an orthonormal polynomial representation.

According to an aspect of the invention there is provided a method of measuring substrate distortion, the method comprising measuring the distortion of the substrate, and transforming the measured distortion data into a frequency domain representation.

The invention also provides a method of measuring substrate distortion, the method comprising measuring the distortion of the substrate, and transforming the measured distortion data into an orthogonal polynomial representation.

The invention also provides a method of measuring substrate distortion, the method comprising measuring the distortion of the substrate, and transforming the measured distortion data into an orthonormal polynomial representation.

Also, the present invention provides apparatus, e.g. a lithography apparatus, including a distortion measurement apparatus; and device manufacturing methods, e.g. lithography methods, using the distortion measurement methods; and devices manufactured thereby.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The present invention provides distortion measurement of substrates. Although not limited thereto, the distortion measurement may be used, e.g., in the lithographic exposure of substrates. FIGS. 1-4 describe illustrative examples of lithographic apparatus, and their operation, in which the present distortion measurement may be used.

Figure 1:
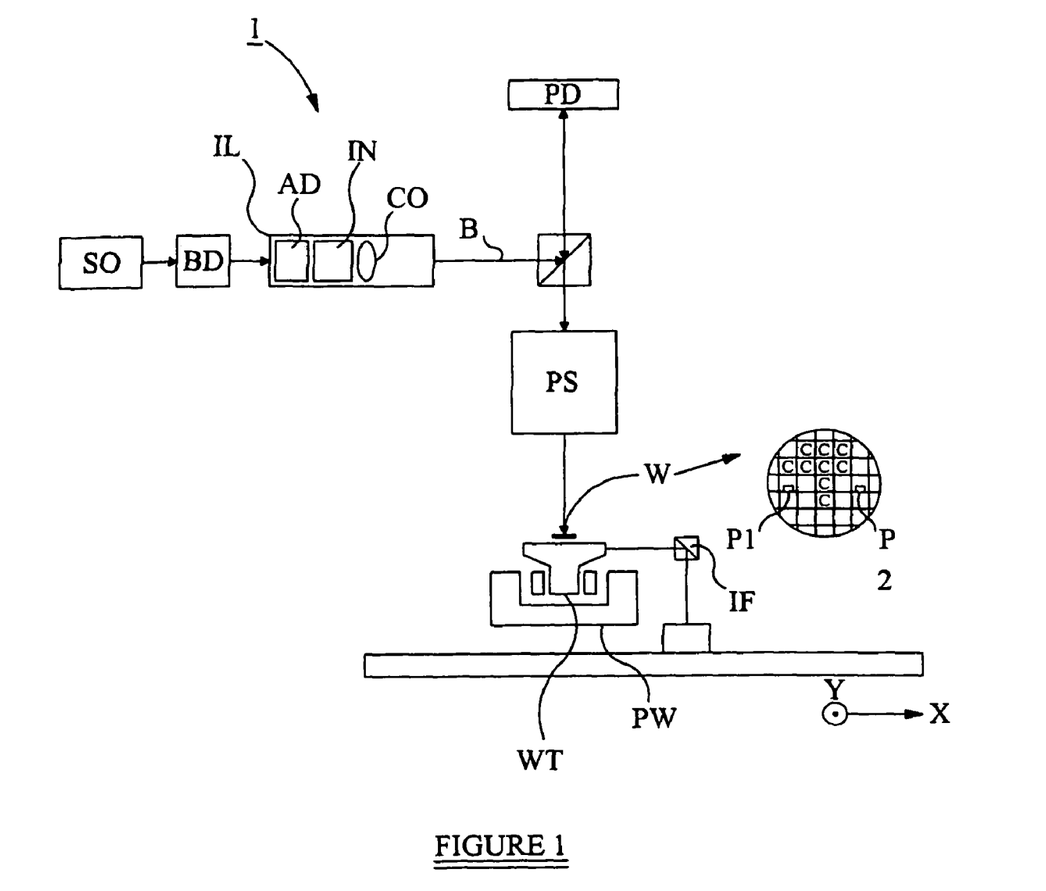
FIG. 1 depicts a lithographic apparatus according to an embodiment of the invention.

FIG. 1 schematically depicts a lithographic apparatus comprising:

- an illumination system (illuminator) IL configured to condition a radiation beam B (e.g. UV radiation);
- a patterning device PD (e.g. an array of individually controllable elements) that modulates the projection beam; in general the position of the array of individually controllable elements will be fixed relative to item PS; however it may instead be connected to a positioner configured to accurately position the array of individually controllable elements in accordance with certain parameters;
- a substrate table WT constructed to support a substrate (e.g. a resist-coated substrate) W and connected to a positioner PW configured to accurately position the substrate in accordance with certain parameters; and
- a projection system (e.g. a refractive projection lens system) PS configured to project the beam of radiation modulated by the array of individually controllable elements onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phaseshifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the said undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic components. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 360 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 360 cm, at most 250 cm, at most 150 cm, or at most 75 cm. In an embodiment, the substrate is a rectangular substrate having a length of about 250-360 cm and a width of about 250-300 cm. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3600 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in, a metrology tool and/or an inspection tool.

In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate; alternatively, the projection system may image secondary sources for which the elements of the array of individually controllable elements act as shutters. In this respect, the projection system may comprise an array of focusing elements such as a micro lens array (known as an MLA) or a Fresnel lens array, e.g. to form the secondary sources and to image spots onto the substrate. In an embodiment, the array of focusing elements (e.g., MLA) comprises at least 10 focus elements, e.g. at least 100 focus elements, at least 1000 focus elements, at least 10000 focus elements, at least 100000 focus elements, or at least 1000000 focus elements. In an embodiment, the number of individually controllable elements in the patterning device is equal to or greater than the number of focusing elements in the array of focusing elements. In an embodiment, the array of focusing elements comprises a focusing element that is optically associated with one or more of the individually controllable elements in the array of individually controllable elements, e.g. with 2 or more of the individually controllable elements in the array of individually controllable elements, such as 3 or more, 5 or more, 10 or more, 20 or more, 25 or more, 36 or more, or 50 or more; in an embodiment, the focusing element is optically associated with less than 5000 individually controllable elements, e.g. less than 2500, less than 1000, less than 500, or less than 100. In an embodiment, the array of focusing elements comprises more than one focusing element (e.g. more than 1000, the majority, or about all) that is optically associated with one or more of the individually controllable elements in the array of individually controllable elements. In an embodiment, the MLA is movable (e.g. with the use of actuators) at least in the direction to and away from the substrate, e.g. with the use of one or more actuators. Being able to move the MLA to and away from the substrate allows, e.g., for focus adjustment without having to move the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 360 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 365 nm, 248 nm, 193 nm, 157 nm, 126 nm, and/or 13.5 nm. In an embodiment, the radiation includes a wavelength of around 365 nm or around 365 nm. In an embodiment, the radiation includes a broad band of wavelengths, for example encompassing 365, 405 and 436 nm. A 365 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a light source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g. an interferometric device, linear encoder or capacitive sensor), the substrate table WT can be moved accurately, e.g. so as to position different target portions C in the path of the radiation beam B.

Where used, the positioning means for the array of individually controllable elements can be used to correct accurately the position of the patterning device PD with respect to the path of the beam B, e.g. during a scan. In an embodiment, movement of the substrate table WT is realized with the aid of a long-stroke module (course positioning) and a short-stroke module (fine positioning), which are not explicitly depicted in FIG. 1. In an embodiment, the apparatus is absent at least a short stroke module for moving substrate table WT. A similar system may also be used to position the array of individually controllable elements. It will be appreciated that the projection beam B may alternatively/additionally be moveable while the object table and/or the array of individually controllable elements may have a fixed position to provide the required relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g. between 5 and 85°, between 15 and 75°, between 25 and 65°, or between 36 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in, e.g., one or more of the following four modes:

1. In step mode, the array of individually controllable elements and the substrate are kept essentially stationary, while an entire pattern imparted to the radiation beam is projected onto a target portion C at one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a desired feature may be created on a substrate by selectively exposing a layer of resist on a substrate to radiation, e.g. by exposing the layer of resist to patterned radiation. Areas of the resist receiving a certain minimum light dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps such as selective etching of the substrate, selective metal deposition, etc. thereby creating the desired feature. Patterning the radiation may be effected by setting the individually controllable elements in a patterning device such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by setting the corresponding individually controllable elements to provide a zero or significantly lower radiation intensity.

In practice, the radiation dose at the edges of the desired feature may not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by setting the individually controllable elements that provide radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the contrast device is a light source itself (e.g. an array of light emitting diodes or laser diodes), grayscaling may be effected, e.g., by controlling the intensity levels of the light being transmitted. If the contrast device is a micromirror device, grayscaling may be effected, e.g., by controlling the tilting angles of the micromirrors. Also, grayscaling may be effected by grouping a plurality of programmable elements in the contrast device and controlling the number of elements within the group that are switched on or off at a given time.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of said point. As a further example, each point on the substrate may potentially receive radiation in a plurality of successive exposures. The radiation dose received by each point may, therefore, be alternatively or additionally controlled by exposing said point using a selected subset of said plurality of successive exposures.

In order to form the required pattern on the substrate, it is necessary to set each of the individually controllable elements in the patterning device to the requisite state at each stage during the exposure process. Therefore, control signals representing the requisite states should be transmitted to each of the individually controllable elements. Preferably, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a radiation dose map (namely a radiation dose profile across the substrate); converting a radiation dose map into radiation intensity values for each individually controllable element; and converting the radiation intensity values for each individually controllable element into corresponding control signals.

Figure 2:
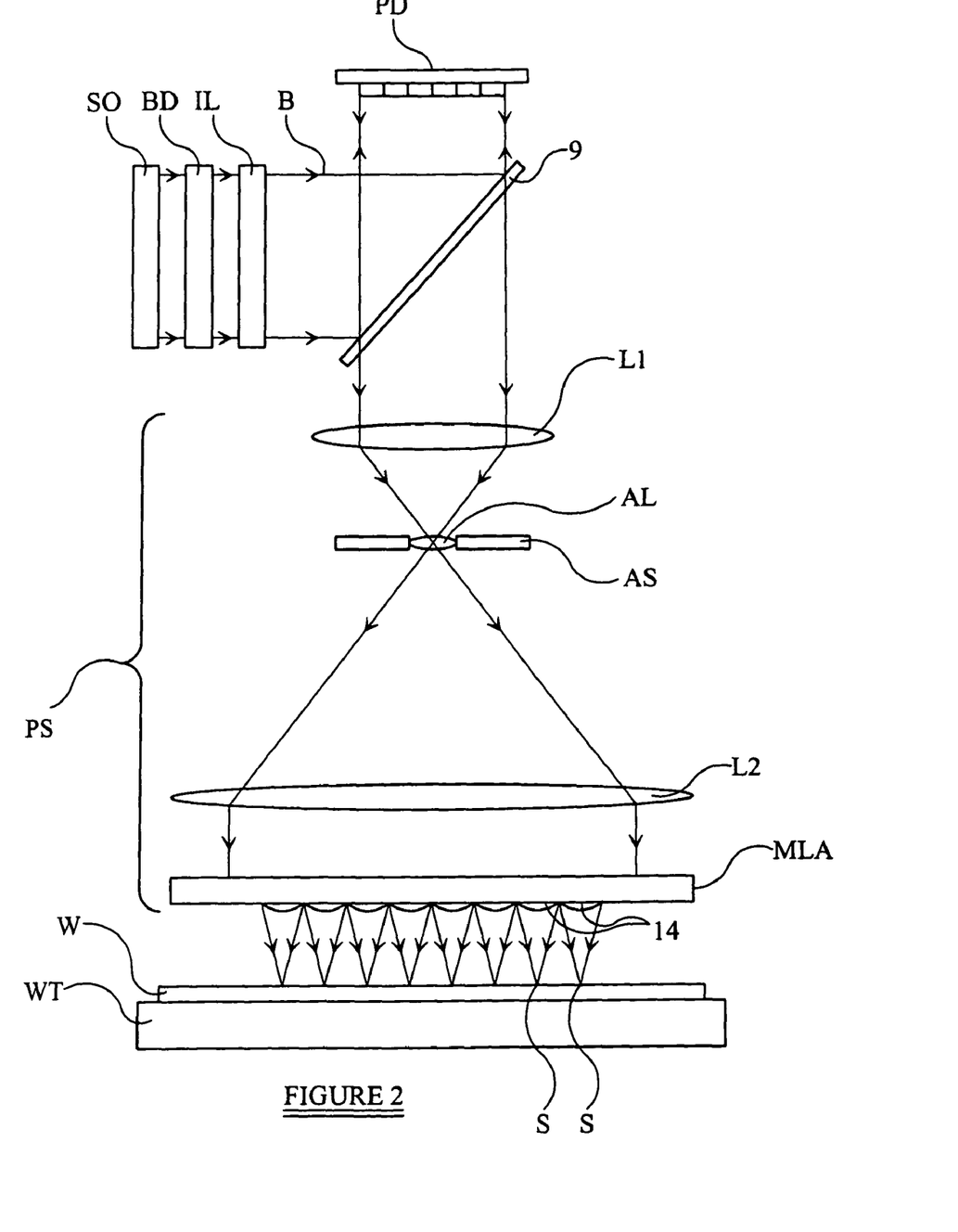
FIG. 2 depicts a lithographic apparatus according to another embodiment of the invention.

FIG. 2 depicts an embodiment of an apparatus according to the present invention that may be used, e.g., in the manufacture of flat panel displays. Components corresponding to those shown in FIG. 1 are depicted with the same reference numerals. Also, the above descriptions of the various embodiments, e.g. the various configurations of the substrate, the contrast device, the MLA, the beam of radiation, etc., remain applicable.

As shown in FIG. 2 the apparatus comprises a radiation source SO, a beam delivery system BD, an illuminator IL, and a projection system PS. The projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point that lies on the substrate W. In this way an array of radiation spots S is exposed onto the substrate W. It will be appreciated that, although only eight lenses ML of the illustrated array of lenses MLA are shown, the array of lenses may comprise many thousands of lenses (the same is true of the array of individually controllable elements used as the patterning device PD).

Figure 3:
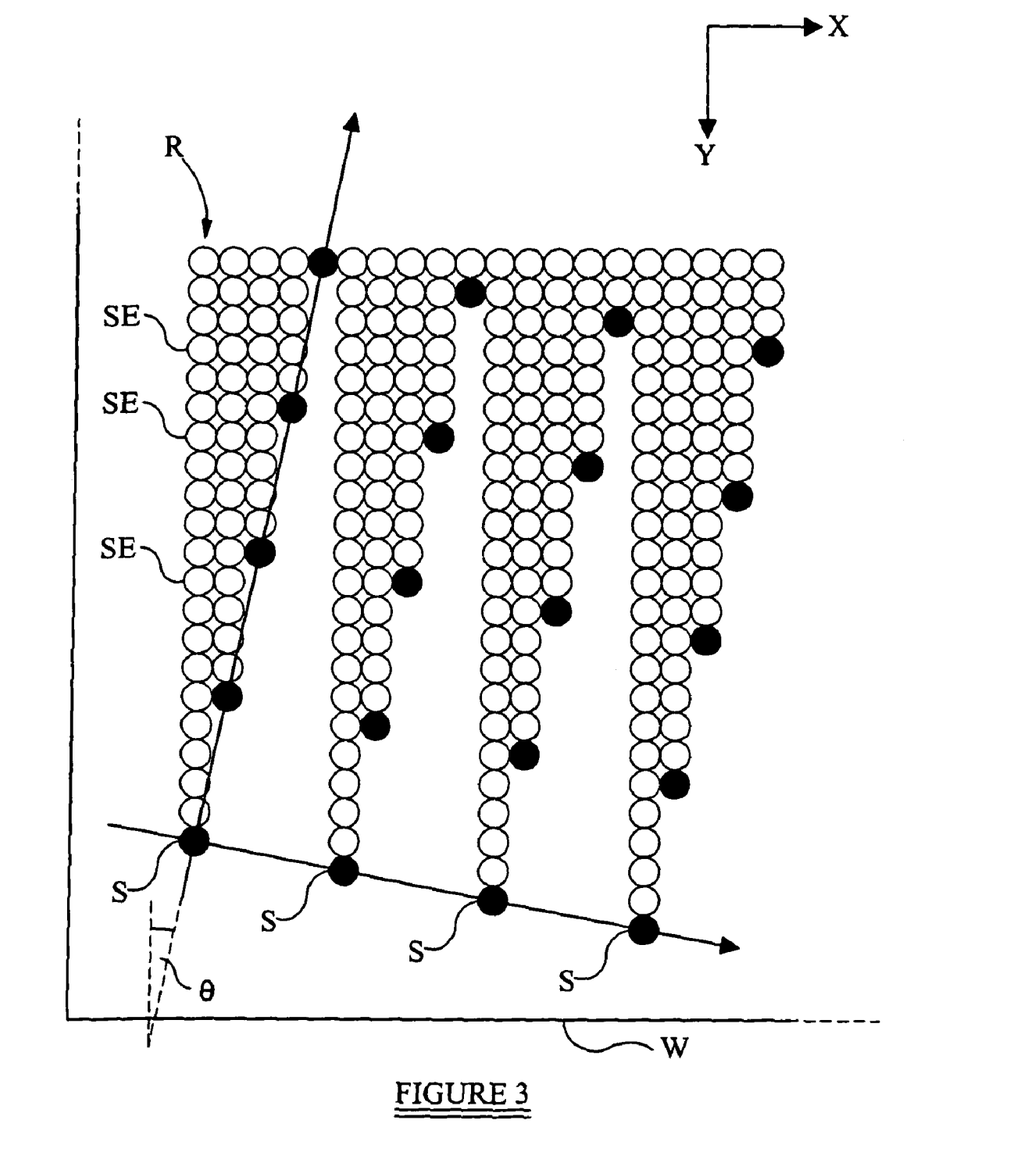
FIG. 3 depicts a mode of transferring a pattern to a substrate using an embodiment of the invention as show in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging." It will be appreciated by those skilled in the art that in practice there will be overlap between the spots S, to allow the surface of the substrate W to be properly exposed. The overlap is not shown in FIG. 3 for simplicity of illustration.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle $\theta$ is at most 20°, 10°, for instance at most 5°, at most 3°, at most 1°, at most 0.5°, at most 0.25°, at most 0.10°, at most 0.05°, or at most 0.01°. In an embodiment, the angle θ is at least 0.0001°, e.g. at least 0.001°.

Figure 4:
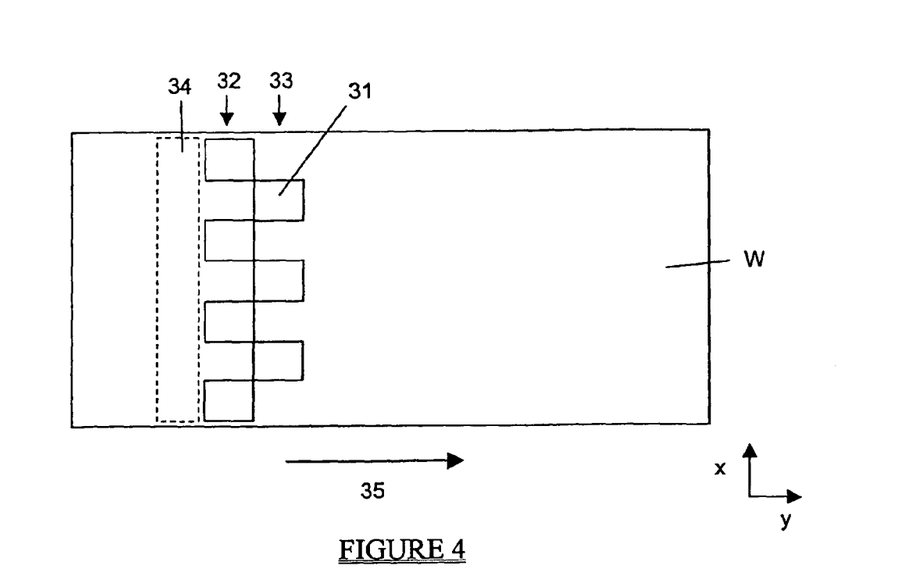
FIG. 4 depicts an arrangement of optical engines.

FIG. 4 shows schematically how an entire substrate W may be exposed in a single scan, by using a plurality of optical engines. Eight optical engines 31 are arranged to produce arrays of radiation spots (not shown). The optical engines 31 are arranged in two rows 32, 33 in a 'chess board' configuration such that the edge of one array of radiation spots slightly overlaps (in the x-direction) with the edge of the adjacent array of radiation spots. A row of detectors 34 is provided above the substrate. The row of detectors 34 is arranged to measure the distortion of the surface of the substrate, i.e. to measure the deviation of for example alignment marks on the substrate from preferred positions. When the substrate is a flexible substrate, for example a substrate formed on flexible plastic or a flat panel display substrate, the distortion measurement may be particularly advantageous.

In an embodiment, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g. less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

The distortion measurement may be obtained for example by providing a plurality of alignment marks that are associated with each die (or other target) located on the substrate W. Deviation of the alignment marks from their desired positions on the surface of the substrate W, as measured by the row of detectors 34, is stored as distortion data. The detectors 34 may comprise any form of alignment detectors, examples of which will be known by those skilled in the art. The detectors 34 may include, or be connected to, analogue to digital converters arranged to convert the distortion measurement into digital distortion data.

If the substrate W does not comprise a plurality of dies or other targets, as may be the case if the substrate is a flat panel display substrate, then some other suitable arrangement of alignment marks may be used. It may be possible to measure the surface of the substrate W without using alignment marks; for example the row of detectors 34 may comprise imaging detectors, which may be used to make distortion measurements based upon pattern recognition of the circuit patterns (or some other functional pattern) provided on the substrate W.

The distortion data is sent to a processor which is connected to the patterning device (see FIG. 1 or FIG. 2). The processor makes adjustments to the pattern to be passed to the patterning device, based upon the measured distortion of the substrate W (i.e. the distortion data). In this way, the pattern projected by the patterning device is distorted in such a way that it corresponds with the distortion of the substrate W, thereby ensuring that the pattern transferred to the substrate is properly aligned with existing pattern layers already provided on the substrate.

The distortion data generally comprises a large set of spatial data, the size of the data set being such that it may be unwieldy, with transmission of the data potentially causing a bottleneck. For this reason, the distortion data may be converted into a more compact format. In one embodiment of the invention, the distortion data is converted from the spatial domain into the frequency domain. The conversion of the distortion data from the spatial domain to the frequency domain is performed by a processor, which in one example applies a Fourier transformation to the distortion data. This may be achieved for example by using the following Fourier transform:

$$F(f) = \frac{1}{\sqrt{2\pi}} \int_{-\infty}^{\infty} f(x) e^{iwx} dx$$

Further details of how to apply a Fourier transform to spatial data to the frequency domain can be found in, e.g., Chapter 10 of Advanced Engineering Mathematics by Erwin Kreyszig (Sixth Edition).

In an embodiment, the above Fourier transform is not directly applied to the distortion data. This is for two reasons. The first reason is that the distortion data consists of discrete points instead of the continuous function represented as $f(x)$ above. The second reason is that the reference points on the substrate may not be equally spaced. In order to overcome this, an additional step of fitting the Fourier series to the distortion data is used (this may for instance use a least squares method).

In an embodiment, the distortion data is two dimensional in character. It will therefore be appreciated that the Fourier transform should be applied in two dimensions.

An infinite number of Fourier expansions is not preferred, since this will tend to cause the resulting data to become erratic. Instead, a limited number is preferably used.

A grid is used to fit the Fourier series to the distortion data. An assumption is made that the grid is sufficiently small that, within each square of the grid, a line represented by the distortion data does not include any curvature. This allows the line to be more easily converted into the frequency domain. A smaller grid size will mean that less inaccuracies are introduced into the frequency domain data. However, the smaller grid size will also mean that more calculations will be required to perform the transformation to the frequency domain, since the number of calculations is proportional to the size of the grid. There is therefore a tradeoff between accuracy and the required number of calculations. The optimum grid size will depend upon the requirements of a given application of the embodiment. For example, if an overlay accuracy of around 0.3 microns is required, then a grid size of roughly 5-10 microns may be used (although this may depend to an extent on, e.g., the type of substrate and the dimensions of the substrate).

The Fourier transform may also be applied to distortion data from which the magnification, skew, rotation and translation have been removed (see further below). Where this is done, an equivalent accuracy of the data in the frequency domain may be achieved with a larger grid size.

It will be appreciated that, instead of using a continuous Fourier transform as described above, a discrete Fourier transform may be used. Discrete Fourier transforms are well known to those skilled in the art, and are particularly appropriate for data in which data points are few and far between (as may the case with data used by embodiments of the invention).

Figure 5:
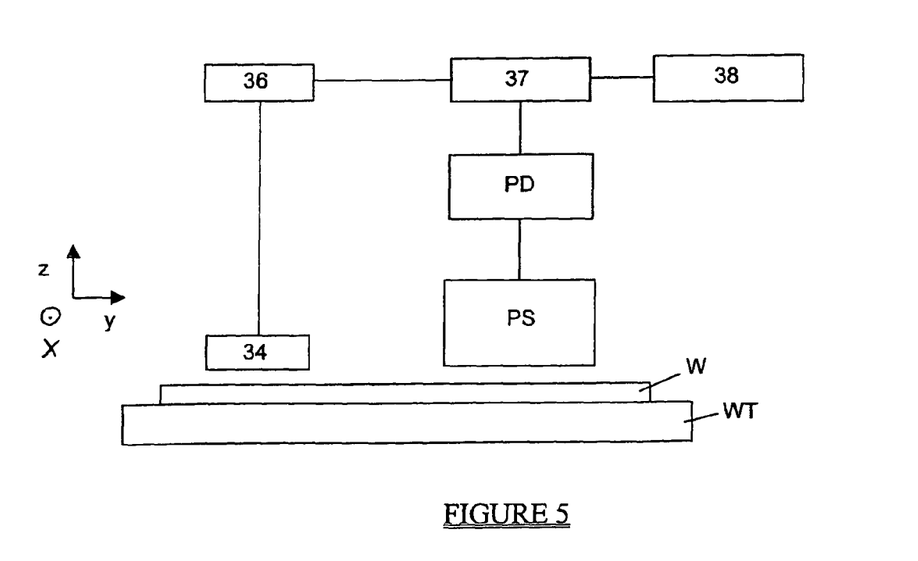
FIG. 5 depicts a lithographic apparatus according to another embodiment of the invention.

FIG. 5 shows schematically a lithographic apparatus which embodies the invention. Where appropriate, reference numerals which have already been used in relation to equivalent parts in earlier figures are also used in FIG. 5. A detector 34 (one of a row extending in the x-direction) is located above a substrate W provided on a substrate table WT. An output from the detector 34 is connected to a transformation processor 36. The transformation processor 36 is arranged to transform spatial data into the frequency domain. An output from the transformation processor 36 passes to the pattern processor 37. The pattern processor 37 is also connected to a memory 38. The memory 38 contains data which corresponds to a pattern to be applied at the patterning device PD for projection via a projection system PS onto the substrate W. For ease of illustration a radiation source and radiation beam conditioning apparatus are not shown in FIG. 5.

In use, the substrate table WT moves in a scanning motion in the y-direction, as shown by arrow 39. A given region of the substrate W passes beneath the detector 34 before it passes beneath the projection system PS. The locations of alignment marks (or other alignment indicators) on the substrate W are measured by the detector 34. The resulting distortion data is passed to the transformation processor 36, which transforms the distortion data into the frequency domain.

The pattern processor 37 receives the frequency domain distortion data, together with pattern data output from the memory 38 (the pattern data corresponds to the pattern that would be projected onto the given region of the substrate W if no distortion of the substrate had occurred). The pattern processor 37 adjusts the pattern data using the frequency domain distortion data and the spatial data, to obtain a distorted pattern (the distortion of the pattern corresponds to the distortion of the substrate). The distorted pattern is passed to the patterning device PD at the moment in time that the given region of the substrate W passes beneath the projection system PS. The distorted pattern is therefore projected onto the distorted substrate W, the distortions of the pattern and the substrate corresponding so that elements of the projected pattern align with and are properly located over previously projected elements of the pattern located on the substrate.

Where so called pixel grid imaging is used, the data may be adjusted to take account of the fact that different parts of the pattern at a given location on the substrate are imaged onto the substrate at different times, for example, as shown in FIG. 3. This may be achieved by sending the data to the patterning device PD with an appropriate time delay. The time delay may be introduced by the pattern processor 37.

Using the frequency domain to represent the distortion data (whether residual or otherwise) is advantageous because less parameters are required to represent the data than if the data were to be represented in the spatial domain. Data transfer may in some instances be a bottleneck in lithographic apparatus which use patterning devices, and may limit the throughput (i.e. number of substrates exposed per hour) of the lithographic apparatus. Transforming the distortion data into the frequency domain removes this bottleneck.

In an embodiment, the invention uses a simple Fourier transform. However, simple Fourier transforms are best suited to data which extends to infinity. In practice, the substrate, and the distortion data, are finite. For this reason a modified Fourier transform may be used, namely a wavelet transform. An example of a wavelet transform is:

$$\gamma(\tau, s) = \int_{-\infty}^{\infty} x(t) \frac{1}{\sqrt{s}} \psi^*\left(\frac{t-\tau}{s}\right) dt$$

where $\tau$ represents translation, s represents scale and $\psi(t)$ is the so-called mother wavelet.

The wavelet transform is used in the same manner as described above in relation to the simple Fourier transform.

It will be appreciated that, instead of using a continuous wavelet transform as described above, a discrete wavelet transform (DWT) may be used. DWT is mentioned in, e.g. U.S. Pat. No. 6,389,074. Discrete wavelet transforms may be particularly appropriate for data in which data points are few and far between (as may be the case with data used by embodiments of the invention).

In an alternative embodiment of the invention, the transformation processor 36 is used to convert the distortion data (residual or otherwise) into orthogonal polynomials rather than into a frequency domain representation. As will be known to those skilled in the art, the term 'orthogonal polynomial' means that the integration between two orthogonal polynomials yields a zero result. Information on orthogonal polynomials can be found in Chapter 4 of Advanced Engineering Mathematics by Erwin Kreyszig (Sixth Edition).

An orthogonal polynomial representation is obtained by fitting a least squares fit to the measurement data, the functions that are fitted being orthogonal polynomials.

Once the distortion data has been transformed, only the scaling coefficients of the orthogonal polynomials are passed on to the pattern processor 37. There, the reverse process takes place: the coefficients belonging to each individual orthogonal polynomial are coupled to the polynomial itself again. All polynomials are added up and this total resulting polynomial is used to calculate the correctional data for each of the imaging points.

An advantage of using the orthogonal polynomial representation is that there is only a limited number of orthogonal polynomials, and hence the number of descriptors needed to describe the polynomials is small (compared to other less efficient representations).

In a further alternative embodiment of the invention, the transformation processor 36 is used to convert the distortion data (residual or otherwise) into orthonormal curves. As will be known to those skilled in the art, the term orthonormal polynomial means that the polynomial runs from a value of X=−1 to a value of X=+1, and the area underneath the curve has a sum of zero (i.e. the integral of the curve from −1 to +1 is zero). Information on orthonormal polynomials can be found in Chapter 4 of Advanced Engineering Mathematics by Erwin Kreyszig (Sixth Edition).

An orthonormal polynomial representation is obtained by fitting a least squares fit to the measurement data, the functions that are fitted being orthonormal polynomials.

Once the distortion data has been transformed, only the scaling coefficients of the orthonormal polynomials are passed on to the pattern processor 37. There the reverse process takes place: the coefficients belonging to each individual orthonormal polynomial are coupled to the polynomial itself again. All polynomials are added up and this total resulting polynomial is used to calculate the correctional data for each of the imaging points.

The use of orthonormal polynomials is advantageous because, since there is a limited number of orthonormal polynomials, only a small number of descriptors is needed to describe them (compared to other less efficient representations).

Although in above described embodiments of the invention, distortion of the substrate W is measured shortly prior to exposure of a pattern onto the substrate, it will be appreciated that the distortion may be measured at an earlier stage. For example, distortion of the substrate W may be measured in a dedicated measurement apparatus. Where this is done it is preferred that the substrate W does not distort after the measurement. In general, distortion of the substrate W occurs during chemical processing and baking of the substrate, and the substrate does not further distort after processing and baking has been completed. This means that distortion measurements obtained using the dedicated apparatus provide accurate distortion measurements which may be used at a later date to allow accurate lithographic projection of a pattern onto the substrate W.

The embodiments of the invention may be used in relation to distortion data which represents and entire substrate, or distortion data which represents a particular region of the substrate. Different regions of the substrate may be represented by separate sets of transformed data. Where this is done, the transformed data may be smoothed to ensure that there are no steps at the boundaries between functions (either in the first order or in the second order).

The distortion data obtained from the row of detectors 34 includes magnification, skew, rotation and translation of the substrate W. It may in some instances be desired to separate these elements from the data. The resulting set of data, which may be considered as residual distortion data, is treated in the manner described above. The magnification, skew, rotation and translation of the substrate W are stored and used separately. For example, the determined translation of the substrate may be corrected for by translating the pattern on the patterning device PD.

In the example, the determination of such a translation can be done by adding all the distortion vectors and dividing this vector by the total number of vectors. The resulting vector describes the total translation of the substrate.

In some instances it may be preferred to determine and store a subset of the magnification, skew, rotation and translation of the substrate W.

Although many of the above-described embodiments of the invention use programmable patterning devices to project a pattern onto the substrate, it will be appreciated that the present invention may be used in mask-based systems, e.g. by using the mask-based systems, it may also be possible to correct the distortion of the substrate by using a lens system to distort a pattern provided on a mask.

For ease of general reference, the pattern processor 37 may be referred to as simply 'the processor'. The transformation processor 36 may be referred to as the 'second processor', and the substrate data processor 35 may be referred to as the 'third processor'.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

Although specific reference may have been made above to the use of embodiments of the invention in the context of optical lithography, it will be appreciated that the invention may be used in other applications, for example imprint lithography, where the context allows, and is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Having described specific embodiments of the present invention, it will be understood that many modifications thereof will readily appear or may be suggested to those skilled in the art, and it is intended therefore that this invention is limited only by the spirit and scope of the following claims.

The invention claimed is:

1. A distortion measurement apparatus comprising:
a patterning device arranged to provide a patterned beam of radiation;
a projection system arranged to receive the patterned beam of radiation from the patterning device and to project the beam of radiation onto the substrate;
a detector arranged to measure physical distortion of a shape of a substrate;
a first processor programmed to receive distortion data indicating the measured physical distortion of the shape of the substrate and to transform the distortion data into a frequency domain representation; and
a second processor programmed to receive data representative of a pattern to be provided on the patterning device, and to use the frequency domain distortion data to adjust the pattern to be provided on the patterning device.

2. The apparatus according to claim 1, wherein the first processor and the second processor are separate entities.

3. The apparatus according to claim 1, wherein the first processor and the second processor are both part of a same entity.

4. The apparatus according to claim 1, wherein the transform to the frequency domain is a Fourier transform.

5. The apparatus according to claim 1, wherein the transform to the frequency domain is a wavelet transform.

6. A distortion measurement apparatus comprising:
a patterning device arranged to provide a patterned beam of radiation;
a projection system arranged to receive the patterned beam of radiation from the patterning device and to project the beam of radiation onto the substrate;
a detector arranged to measure physical distortion of a shape of a substrate;
a first processor programmed to receive distortion data indicating the measured physical distortion of the shape of the substrate and to transform the distortion data into an orthogonal polynomial representation; and
a second processor programmed to receive data representative of a pattern to be provided on the patterning device, and to use the orthogonal polynomial distortion data to adjust the pattern to be provided on the patterning device.

7. The apparatus according to claim 6, wherein the first processor and the second processor are separate entities.

8. The apparatus according to claim 6, wherein the first processor and the second processor are both part of a same entity.

9. A distortion measurement apparatus comprising:
a patterning device arranged to provide a patterned beam of radiation;
a projection system arranged to receive the patterned beam of radiation from the patterning device and to project the beam of radiation onto the substrate;
a detector arranged to measure physical distortion of a shape of a substrate; and
a first processor programmed to receive distortion data indicating the measured physical distortion of the shape of the substrate and to transform the distortion data into an orthonormal polynomial representation; and
a second processor programmed to receive data representative of a pattern to be provided on the patterning device, and to use the orthonormal polynomial distortion data to adjust the pattern to be provided on the patterning device, to correct for the measured physical distortion of the shape of the substrate.

10. The apparatus according to claim 9, wherein the first processor and the second processor are separate entities.

11. The apparatus according to claim 9, wherein the first processor and the second processor are both part of a same entity.

12. A method of measuring lithographic substrate physical distortion, the method comprising:
measuring the physical distortion of a substrate with a detector;
transforming the measured distortion data into a frequency domain representation; and
receiving data representative of a pattern to be provided on a patterning device, using the frequency domain distortion data to adjust the pattern data to correct for the measured physical distortion of the shape of the substrate, then sending the adjusted pattern data to the patterning device, and using the patterning device to pattern a beam of radiation which is projected onto the substrate.

13. A method of measuring lithographic substrate physical distortion, the method comprising:
measuring the physical distortion of a shape of a substrate with a detector;
transforming the measured distortion data into an orthogonal polynomial representation; and
receiving data representative of a pattern to be provided on the patterning device, using the orthogonal polynomial distortion data to adjust the pattern data to correct for the measured physical distortion of the shape of the substrate, then sending the adjusted pattern data to a patterning device, and using the patterning device to pattern a beam of radiation which is projected onto the substrate.

14. A method of measuring lithographic substrate physical distortion, the method comprising:
measuring physical distortion of a shape of a substrate with a detector;
transforming measured distortion data into an orthonormal polynomial representation; and
receiving data representative of a pattern to be provided on the patterning device, using the orthonormal polynomial distortion data to adjust the pattern data to correct for the measured physical distortion of the shape of the substrate, then sending adjusted pattern data to the patterning device, and using the patterning device to pattern a beam of radiation which is projected onto the substrate.

15. The apparatus according to claim 1, wherein, the detector is arranged to measure the physical distortion of the shape of the substrate by measuring deviation of an alignment mark on the substrate from a preferred position.

16. The method according to claim 12, wherein, the detector is arranged to measure the physical distortion of the shape of the substrate by measuring deviation of an alignment mark on the substrate from a preferred position.

17. The method according to claim 13, wherein the physical distortion of a shape of a substrate is measured by measuring a deviation of an alignment mark on the substrate from a preferred position.

18. The method according to claim 14, wherein the physical distortion of a shape of a substrate is measured by measuring a deviation of an alignment mark on the substrate from a preferred position.

* * * * *